United States Patent [19]
Ma

[11] Patent Number: 5,225,968

[45] Date of Patent: Jul. 6, 1993

[54] CONNECTING APPARATUS FOR CONNECTING COMPUTER FUNCTIONAL CARDS TO A MOTHER BOARD

[76] Inventor: Hsi K. Ma, 4F., No. 48, Sec. 2 Chung Cherng Rd., Taipei, Taiwan

[21] Appl. No.: 848,196

[22] Filed: Mar. 10, 1992

[51] Int. Cl.[5] .................... H01R 23/72; H05K 7/14
[52] U.S. Cl. .................... 361/413; 235/1 D; 361/392; 361/393; 361/396; 361/399; 439/44; 439/45; 439/75
[58] Field of Search ............ 235/1 D, 492, 494; 361/392, 393, 394, 396, 399, 412, 413, 415; 439/44, 64, 45, 377, 50, 62, 65, 69, 74, 75; 364/708

[56] References Cited

U.S. PATENT DOCUMENTS

| | | | |
|---|---|---|---|
| 3,191,099 | 6/1965 | Rezek | 439/377 |
| 5,033,972 | 7/1991 | Komatsu et al. | 439/377 |
| 5,113,317 | 5/1992 | Howe | 361/415 |

FOREIGN PATENT DOCUMENTS

| | | | |
|---|---|---|---|
| 1-144699 | 6/1989 | Japan | 361/415 |
| 2-278675 | 11/1990 | Japan | 439/64 |

OTHER PUBLICATIONS

IBM Disclosure Bulletin "Integrated Connector/Rail System for Small Printed Circuit Cards" vol. 30 No. 6 Nov. 1987.

Primary Examiner—Lincoln Donovan
Assistant Examiner—D. Sparks
Attorney, Agent, or Firm—Bacon & Thomas

[57] ABSTRACT

A computer functional card connecting apparatus comprised of a base having two parallel channel frames at two opposite ends thereof at right angles, wherein the base has a step block longitudinally disposed at the top with pin holes formed thereon, an elongated groove longitudinally disposed on the bottom with vertical contact pins made thereon for connecting to a mother board, transverse contact pins on an inner side for electrically connecting a computer functional card that has been inserted in between the two parallel channel frames, and a circuit board set between the step block and the bottom groove for electrically connecting said transverse contact pins, the vertical contact pins and the pin holes. Dowels and dowels holes are made on the two parallel channel frames at suitable locations so that the dowels of one computer functional card connecting apparatus can be respectively inserted in the dowel holes on another computer functional card connecting apparatus for positioning when two or more computer functional card connecting apparatus are attached together.

2 Claims, 3 Drawing Sheets

CONNECTING APPARATUS FOR CONNECTING COMPUTER FUNCTIONAL CARDS TO A MOTHER BOARD

BACKGROUND OF THE INVENTION

The present invention relates to connecting apparatus, and more particularly, the present invention relates to a connecting apparatus for connecting a computer functional card to a mother board. Further, the structure is so arranged that two or more connecting apparatus can be conveniently attached together with less space occupation.

In order to make a personal computer versatile, different functional cards may be used. When a computer functional card is to be used, it must be connected to the mother board of a computer by a connecting apparatus. FIGS. 1 and 2 illustrate a computer functional card connecting apparatus for connecting a computer functional card to a computer mother board. As illustrated, the connecting apparatus (10) comprises a transverse body (40) having two parallel side walls (20) at two opposite ends at right angles. The parallel side walls (20) define therein a channel (30) for inserting a computer functional card, for example, and IC card (60). The transverse body (40) has rows of contact pins (50) transversely vertically disposed at two adjacent sides, wherein the transverse contact pins are to be inserted into the pin holes (70) on the IC card (60) that has been inserted into the channel (30); the vertical contact pins are to be connected to a computer mother board. Therefore, a computer functional card can be conveniently connected to a computer mother board. However, this structure of computer functional card connecting apparatus is still not satisfactory in use because it is effective for connecting a single computer functional card through a transverse loading process.

The present invention has been accomplished under the aforesaid circumstances. It is therefore the main object of the present invention to provide a connecting apparatus for connecting a computer functional card to a computer mother board, which is so arranged that two or more connecting apparatus can be conveniently attached together with less space occupation.

DETAILED DESCRIPTION OF THE PREFERRED EMBODIMENT

Figure 1:
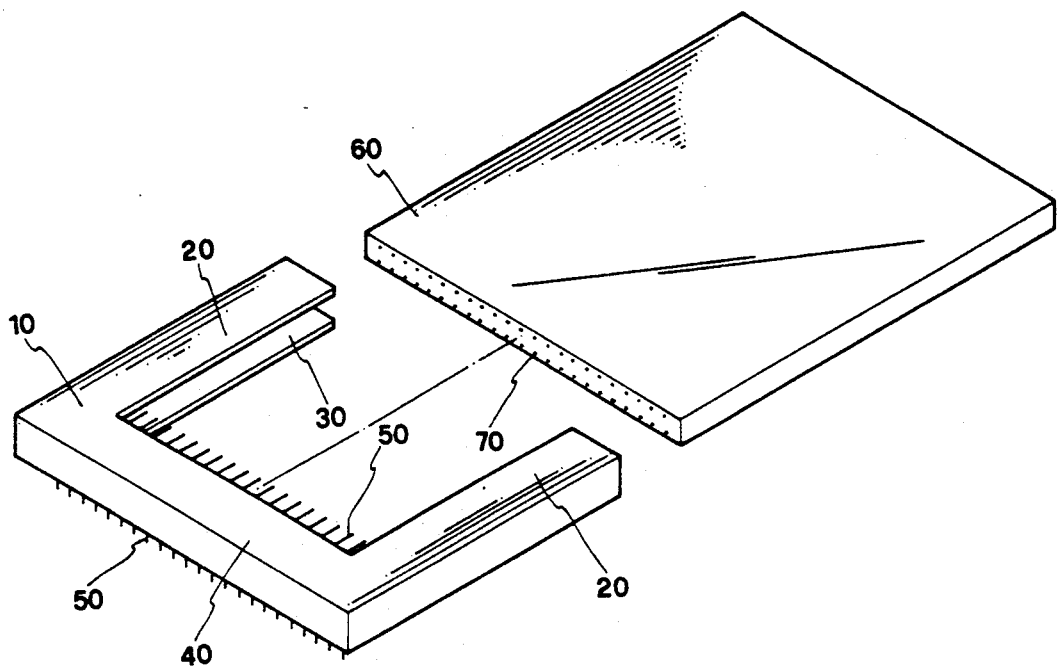
FIG. 1 illustrates a computer functional card connecting apparatus according to the prior art.
Figure 2:
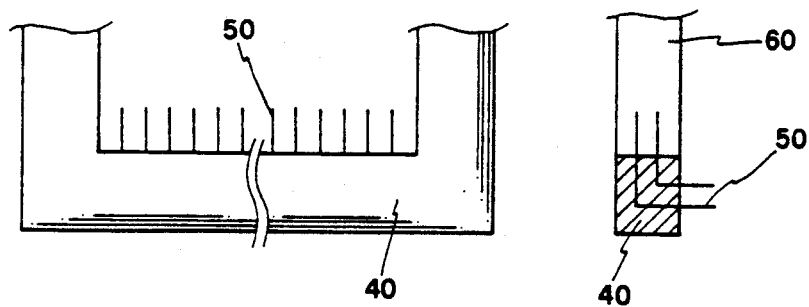
FIG. 2 is sectional views showing the structure of the computer functional card connecting apparatus of FIG. 1 and its connection with an IC card.
Figure 3:
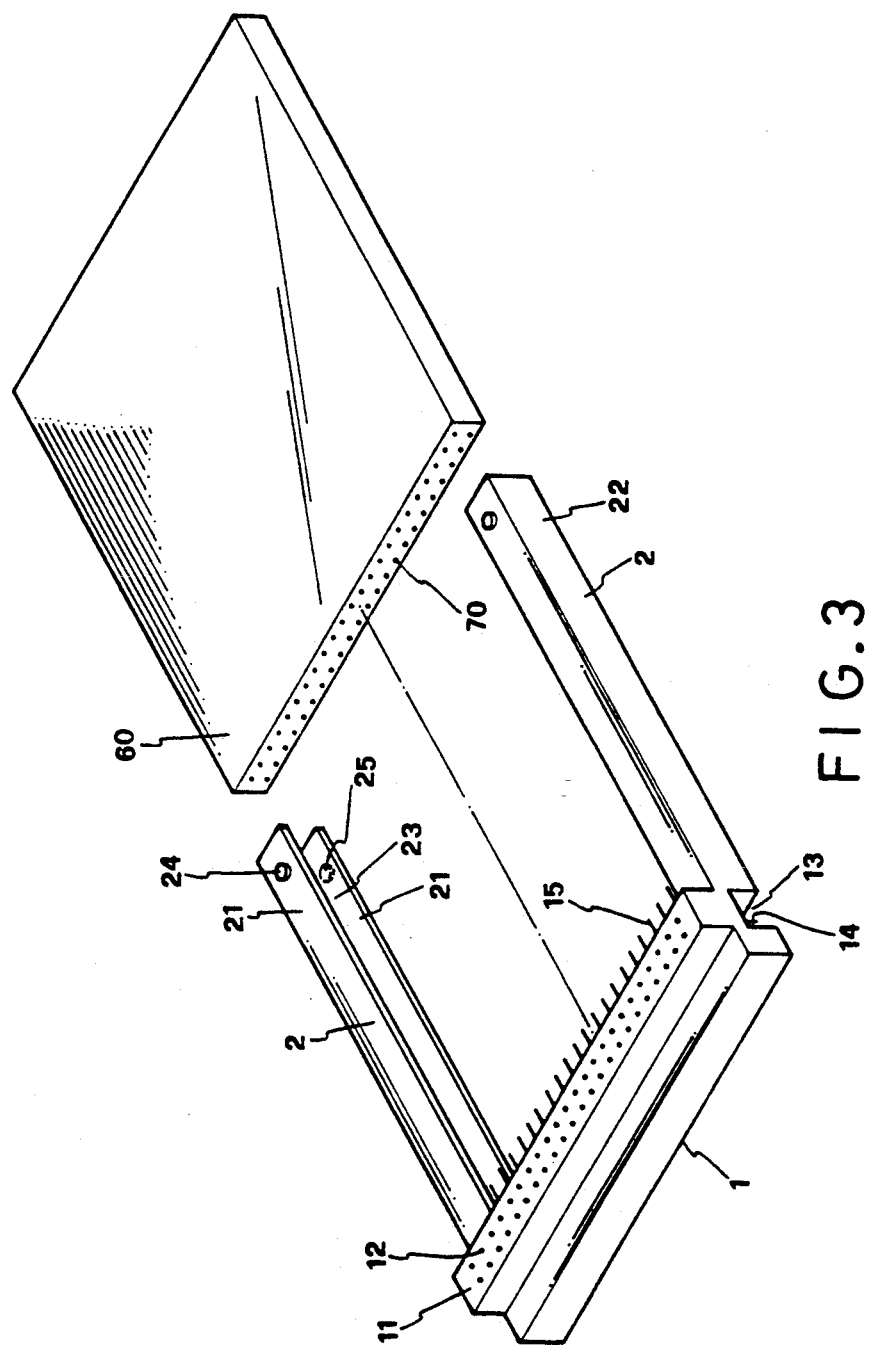
FIG. 3 is a perspective view of a connecting apparatus embodying the present invention.

Referring to FIG. 3, a computer functional card connecting apparatus as constructed in accordance with the present invention is generally comprised of a base 1 having two parallel side frames 2 at two opposite ends thereof at right angles. The base 1 is made in an elongated structure having a step block 11 longitudinally disposed at the top, a bottom groove 13 longitudinally disposed at the bottom below the step block 11, wherein a plurality of pin holes 12 are made on the top edge of the step block 11, and a plurality of contact pins 14 are made on bottom groove 13 at locations corresponding to the pin holes 12 for connecting to a mother board. The bottom groove 13 is made in such a size that the step block 11 of another computer functional connecting apparatus can be tightly fit therein. When the step block 11 of one computer functional connecting apparatus is inserted in the bottom groove 13 of another computer functional connecting apparatus, the contact pins 14 of the upper computer functional connecting apparatus are respectively inserted into the pin holes 12 on the lower computer functional connecting apparatus. The base 1 further comprises a plurality of contact pins 15 transversely disposed at the back side thereof.

Figure 4:
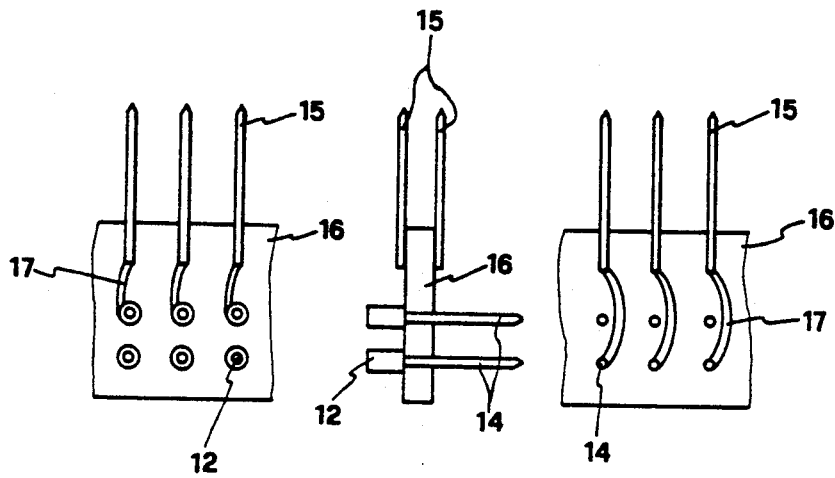
FIG. 4 are the three side views showing that the contact pins and the pin holes on the base are respectively electrically connected to a circuit board.

Referring to FIG. 4 and seeing FIG. 3 again, there is a circuit board 16 made in size corresponding to the base 1 and set between the step block 11 and the bottom groove 13 for electrically connecting the contact pins 14, 15 and the pin holes 12. The circuit board 16 has electric circuits 17 connecting between the contact points of the contact pins 14 and the contact points of the contact pins 15, and therefore, the pin holes 12 and the contact pins 14, 15 are respectively electrically connected. When a computer functional card, for example, an IC card 60 is attached to the base 1, the contact pins 15 are respectively inserted into the pin holes 70 on the IC card 60, they become electrically connected.

Figure 5:
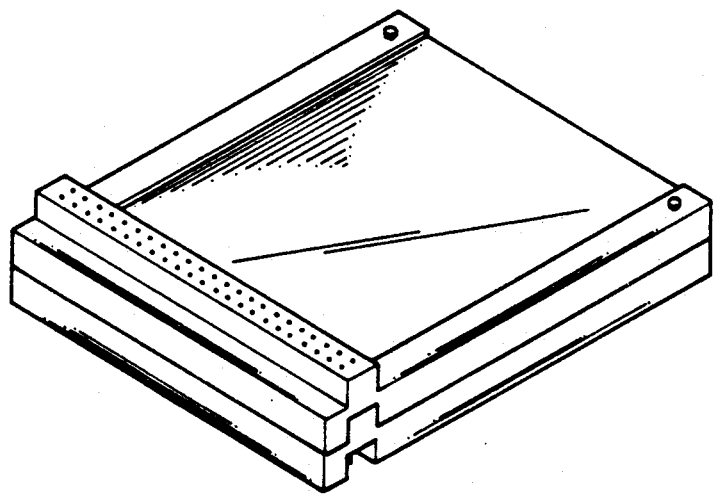
FIG. 5 is an elevational view showing that an IC card has been attached to a connecting apparatus as constructed in accordance with the present invention.

Referring to FIG. 3 again, the side frames 2 are symmetrical and shaped like a channel bar. Each side frame 2 is comprised of an elongated base wall 22 having two parallel side walls 21 bilaterally disposed at right angles with a channel 23 defined therein for inserting a computer functional card. Further, dowels 24 and holes 25 are respectively made on the two parallel side walls 21 of each side frame 2, and therefore, the dowels 24 of on one computer functional card connecting apparatus can be respectively inserted in the holes 25 on another computer functional card connecting apparatus when two or more computer functional card connecting apparatus are attached together (as shown in FIG. 5).

What is claimed is:

1. For connecting a computer functional card to a mother board, a computer functional card connecting apparatus comprised of a base having two parallel channel frames at two opposite ends thereof at right angles, wherein said base has a step block longitudinally disposed on a top edge thereof, an elongated groove longitudinally disposed on a bottom edge thereof below said step block, rows of pin holes on said step block, rows of vertical contact pins on said elongated groove at locations corresponding to said pin holes for connecting to a mother board, rows of transverse contact pins on an inner side thereof for electrically connecting a computer functional card inserted in between said two parallel channel frames, and a circuit board set between said step block and said bottom groove for electrically connecting said rows of transverse contact pins, said rows of vertical contact pins and said pin holes; said two parallel channel frames each comprised of an elongated base wall having two parallel side walls bilaterally disposed at right angles with a channel defined therein for inserting a computer functional card.

2. The connecting apparatus of claim 1, wherein dowels and dowel holes are respectively made on said two parallel side walls of each side frame, so that the dowels of one computer functional card connecting apparatus can be respectively inserted in the dowel holes on another computer functional card connecting apparatus for positioning when two or more computer functional card connecting apparatus are attached together.

* * * * *